United States Patent
Subramanian

(10) Patent No.: US 6,821,866 B2
(45) Date of Patent: Nov. 23, 2004

(54) METHOD OF IDENTIFYING WAFER CUTTING POSITIONS OF DIFFERENT SIZE PARTIAL WAFERS

(75) Inventor: Balamurugan Subramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 39 days.

(21) Appl. No.: 10/386,240

(22) Filed: Mar. 11, 2003

(65) Prior Publication Data

US 2004/0180513 A1 Sep. 16, 2004

(51) Int. Cl.[7] .............................................. H01L 21/301
(52) U.S. Cl. ...................... 438/460; 438/461; 438/462; 438/463; 438/464
(58) Field of Search ............................... 438/460, 461, 438/462, 463, 464

(56) References Cited

U.S. PATENT DOCUMENTS

| | | | |
|---|---|---|---|
| 6,156,625 A | | 12/2000 | Balamurugan |
| 6,174,788 B1 | | 1/2001 | Balamurugan |
| 6,216,055 B1 | | 4/2001 | Balamurugan et al. |
| 6,368,761 B1 | * | 4/2002 | Chien et al. .................. 430/22 |
| 6,477,685 B1 | * | 11/2002 | Lovelace ....................... 716/4 |
| 6,705,925 B1 | * | 3/2004 | Cole et al. .................... 451/36 |
| 2002/0121915 A1 | * | 9/2002 | Montull et al. ............. 324/765 |
| 2004/0029491 A1 | * | 2/2004 | Hubbell, III .................. 451/11 |
| 2004/0080737 A1 | * | 4/2004 | Jasper et al. .................. 355/55 |
| 2004/0091141 A1 | * | 5/2004 | Hsu ........................... 382/141 |
| 2004/0130691 A1 | * | 7/2004 | Boonman et al. ............. 355/53 |

* cited by examiner

*Primary Examiner*—Matthew Smith
*Assistant Examiner*—Victor V Yevsikov
(74) *Attorney, Agent, or Firm*—W. James Brady, III; Frederick J. Telecky, Jr.

(57) ABSTRACT

A tool and method is described to decide partial wafer sizes to process multiple random sizes of wafers in pick and place equipment for wafermap operation. The tool identifies the wafer and gets wafermap data. The position of one or more cutters is displayed. The position of the cutters relative to the wafer is displayed. The tool generates and displaying the results of the type of dies in each partial that would result from a cut according to said displayed position of the cutters.

10 Claims, 6 Drawing Sheets

METHOD OF IDENTIFYING WAFER CUTTING POSITIONS OF DIFFERENT SIZE PARTIAL WAFERS

FIELD OF INVENTION

This invention relates to pick and place equipment in semiconductor manufacturing and more particularly to a tool and method to decide partial wafer sizes to process multiple random size wafers.

BACKGROUND OF INVENTION

The wafermap process eliminates the inking of reject die at the wafer fab by using the map data available from the probe test to position the wafer to exact location of all the good die on the Die Bonder or Tape & Reel. Hence, direct jumps to good die are possible without scanning the whole wafer. See FIG. 1 for a typical wafer.

In wafermapping environment, the wafermap data contains good, bad, plug and edge dies coordinates with reference to a Reference die of a wafer. A Bin in wafermap data is a category of dies. For example, Bin 1 is all good first grade dies, Bin 2 is all good second grade dies, Bin 3 is all Plug dies, Bin 4 is all bad edge dies and Bin 5 is remaining bad dies.

With small die wafers having high chips per wafer count, the wafers are also processed in halves, quarters and other sizes to match the production lot size at the Assembly And Test site. Thus, partial wafer processing is very much an operational requirement for small die wafers unlike large die wafers.

Since each good die is valuable a partial wafer is even more valuable. Partial wafers are formed by cutting a wafer into half (two pieces) or quarter (four pieces) or other different size pieces (multiple pieces). See FIG. 2 for a half pieces, FIG. 3 for quarter pieces and FIG. 4 for other multiple pieces. A fabricator may know how many good dies are needed but with or without wafermap operation, it is difficult to decide for a production demand where to cut a wafer and how many pieces are required. Currently, no known tool exists to perform this type of operation.

SUMMARY OF INVENTION

In accordance with one embodiment of the present invention a method and tool for deciding and providing a partial wafer size for production demands includes the steps of getting wafermap data, providing the coordinates of the one or more cutters relative to the wafer and moving the one or more cutters relative to the wafer to determine the cut of the wafer to form the desired partial wafer.

In accordance with another embodiment of the present invention the method steps include providing the coordinates of a pair of orthogonal oriented wafer cutters, getting wafermap data of good dies and moving the coordinate positions of the cutters relative to the wafer and displaying the results of the type of dies in each partial that would result from the cut according to said wafermap data.

In accordance with another embodiment of the present invention the tool automatically queries the number of good dies wanted and the type of partial wafer selected and the system automatically decides the cut position or one or more cutters.

DESCRIPTION OF PREFERRED EMBODIMENTS

Figure 1:
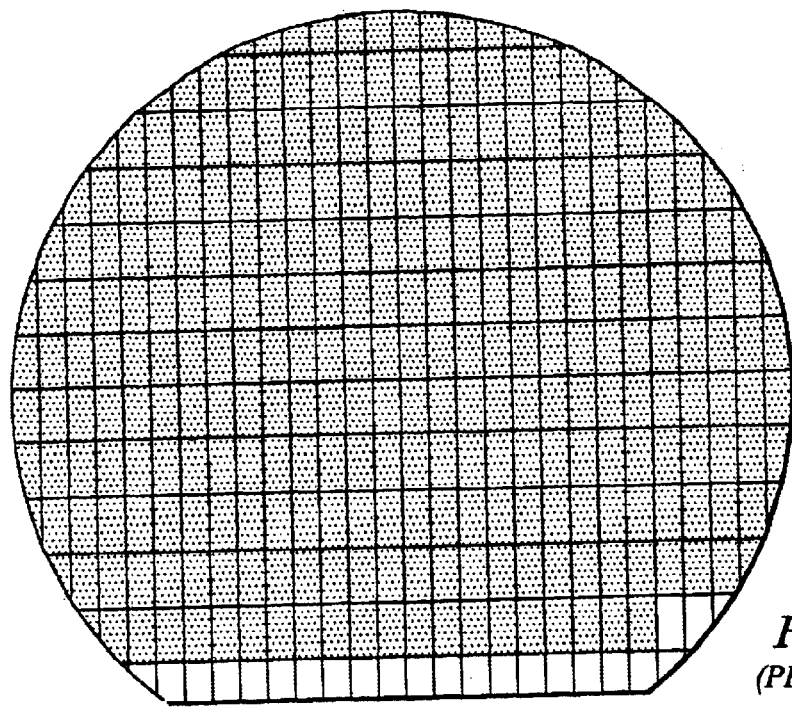
FIG. 1 illustrates a typical wafer.
Figure 2:
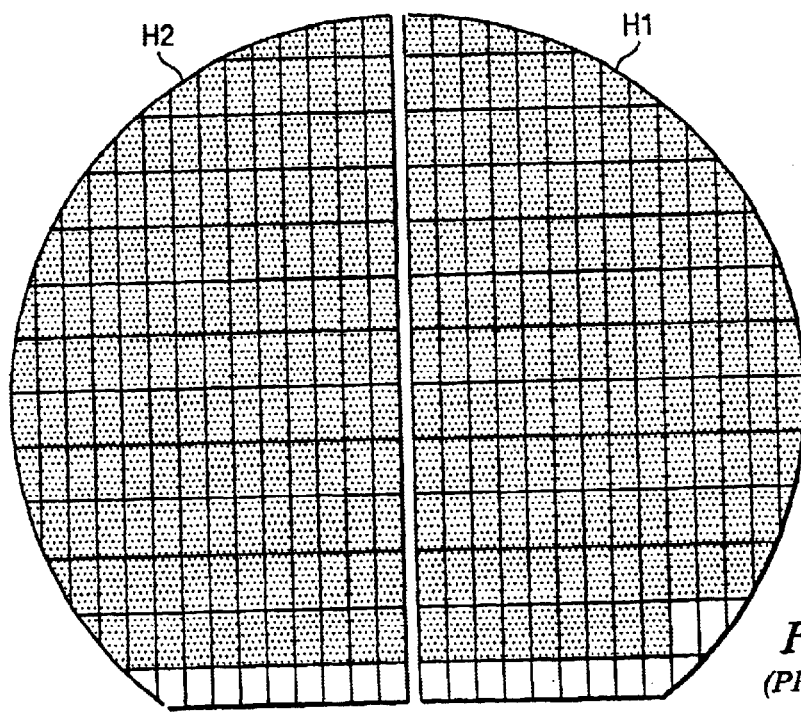
FIG. 2 illustrates half wafers.
Figure 3:
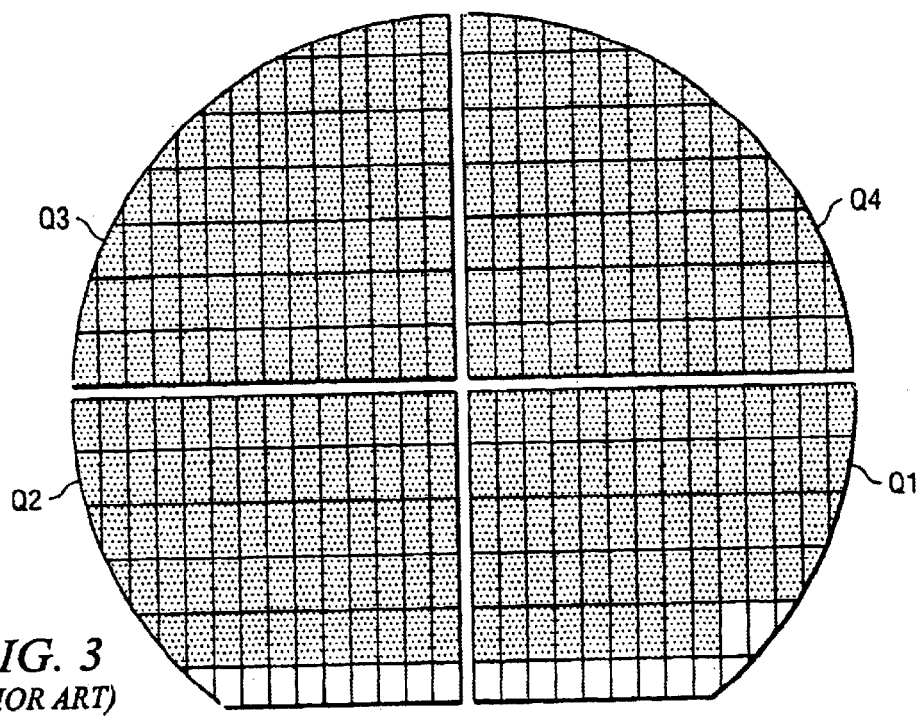
FIG. 3 illustrates quarter wafers.
Figure 4:
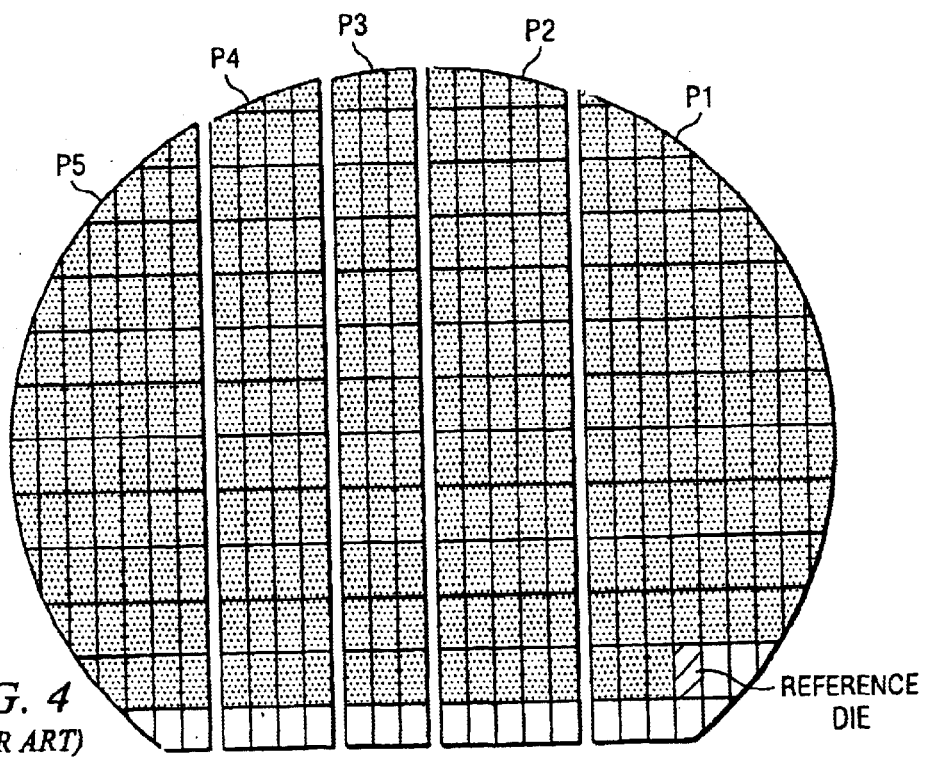
FIG. 4 illustrates multiple partial wafers cut perpendicular to the flat.
Figure 5:
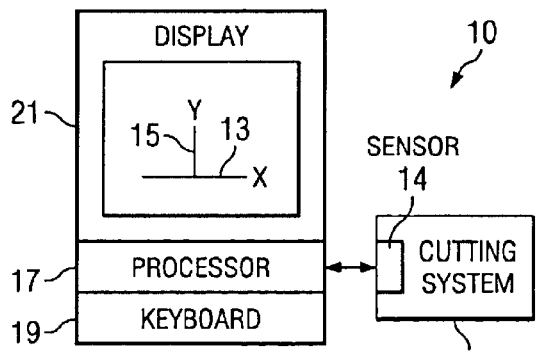
FIG. 5 illustrates a tool according to one embodiment of the present invention.

Referring to FIG. 5 there is illustrated a tool 10 according to one embodiment of the present invention. The tool 10 is connected to a cutting system 11 including a wafer table and a pair of movable cutters. The tool 10 further includes a processor 17, a keyboard 19 and a display 21. The tool 10 at display 21 displays the wafer on the wafer table and illustrates by lines 13 and 15 on the display the coordinate positions of orthogonal cutters in the cutter system 11. The cutters extend in the X and Y directions and are orthogonal to each other. One of the cutters 13 as illustrated by the display is movable in the Y direction and the other orthogonal cutter 15 illustrated by the display is movable in the X direction. The cutting system 11 includes a sensor 14 for sensing the position of the cutters relative to the wafer on the wafer table. The processor 17 receives input signals from the sensor 14 indicating the position of the orthogonal cutters and this is displayed on the display screen 21. The processor 17 also receives wafermap data from an external server or from its hard disk memory or floppy disk memory. The keyboard 19 also provides inputs to processor 17. The processor 17 processes the inputs and displays a wafermap and data at display 21.

Figure 6:
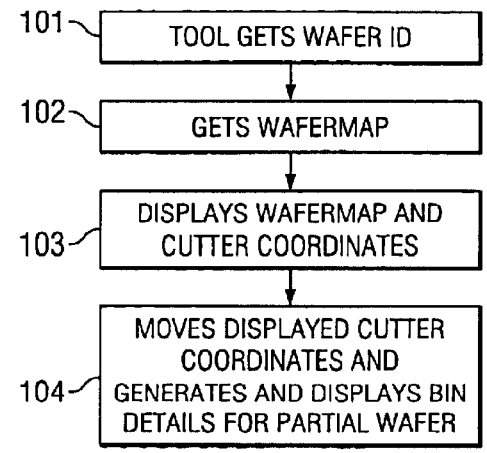
FIG. 6 is a flow diagram according to one embodiment of the present invention.

The processor 17 includes a program that follows the steps illustrated by one embodiment in FIG. 6. As illustrated by Step 101, the tool 10 gets the wafer identification by the user entering the identification number or characters into the processor by the keyboard 19. The processor 17 gets the wafermap data file that includes the good and bad die locations and bin numbers from a wafermap data server or local disk file or floppy disk file (Step 102).

Figure 7:
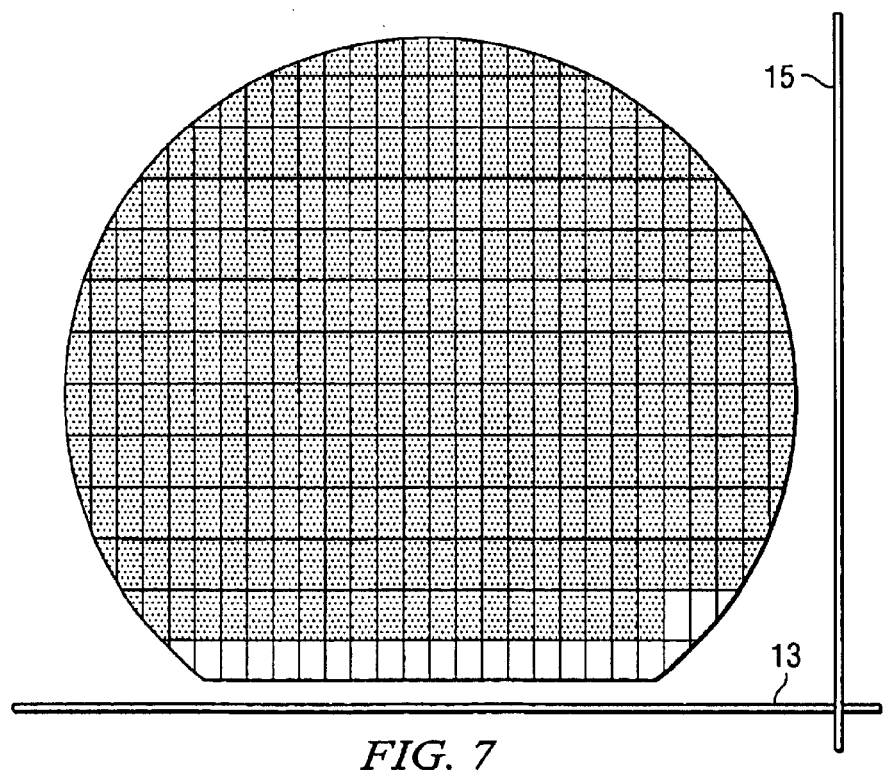
FIG. 7 illustrates two orthogonal cutters for cutting the wafer.

Referring to FIG. 5 the position of the pair of orthogonal pair of cutters (illustrated by cutters 13 and 15 in the display) is sensed at sensor 14 and provided to the processor 17 and on the display 21. The processor 17 processes the wafermap data and the sensed coordinates of the orthogonal cutters of the cutter system 11 to display the coordinate position of the orthogonal cutters 13 and 15 and displays the wafermap oil the display 21 (Step 103). FIG. 7 illustrates the tool 10 display 21 of the position of the two cutters 13 and 15 and the wafer before any selection of coordinates on the wafer.

When the user places the illustrated cutters 13 and 15 on the wafer illustrated in the display by the tool 10 the bin details for each quadrant (Step 104) or each partial wafer resulting from a cut at the indicated positions of the orthogonal cutters is generated and displayed.

Figure 8:
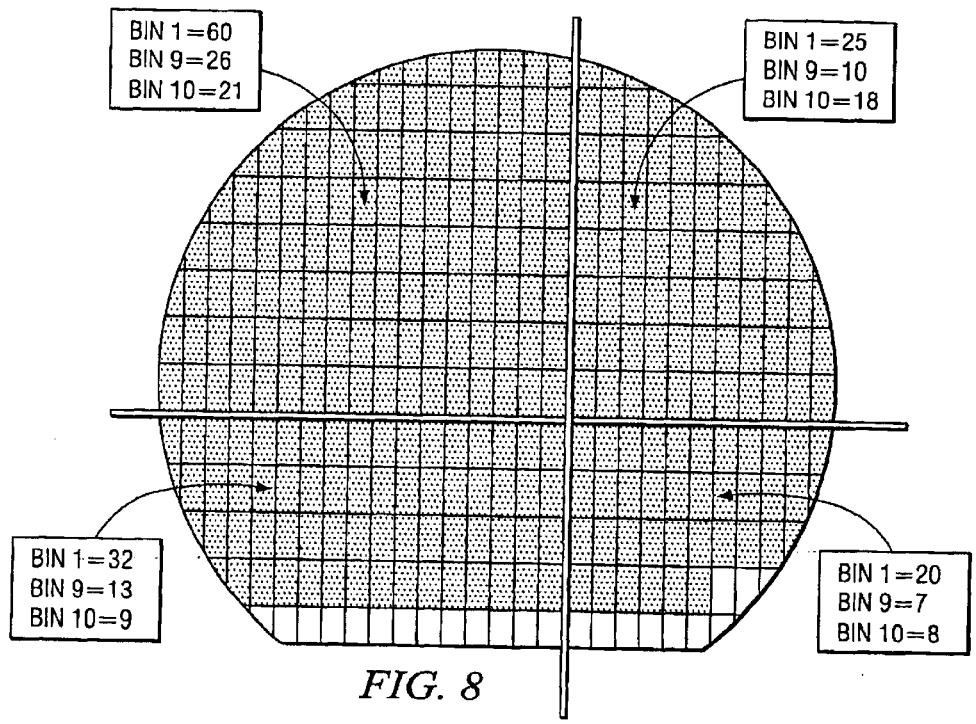
FIG. 8 illustrates two cutters with bin details according to one embodiment of the present invention.

FIG. 8 illustrates the bin details for each quadrant for the displayed position of the two cutters 13 and 15. For quadrant Q1, the bin details are: Bin 1=20, Bin 9=7 and Bin 10=8. For quadrant Q2, the bin details are: Bin 1=32, Bin 9=13 and Bin 10=9. For quadrant Q3, the bin details are: Bin 1=60, Bin 9=26 and Bin 10=21. For quadrant Q4, the bin details are: Bin 1=25, Bin 9=10, and Bin 10=18. Bin 1 usually relates to the best dies.

The user of the tool 10 moves the illustrated position of the cutters so that the partial wafer cuts a partial wafer that fits the demand. For example, if 25 good dies are requested, the partial wafer could be quadrant Q4 in the above illustration. The position of the illustrated cutters on the display is moved to the position where the partial wafer section is the one that provides the desired number of good dies. Similarly, the cut position may be based on the secondary bin dies or first and secondary dies. This coordinate information may then be sent to the cutting system 11 to cut the partial wafer.

Figure 9:
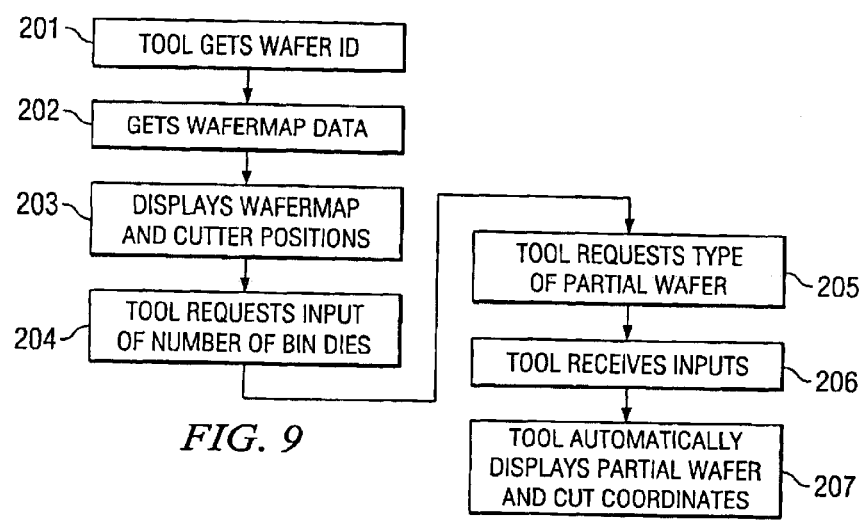
FIG. 9 is a flow diagram according to another embodiment of the present invention.

FIG. 9 illustrates the step of a program in the processor 17 in accordance with another embodiment of the present invention. The user enters the identification number of the wafer in the keyboard (Step 201) as done previously. The processor 17 gets the wafermap data (Step 202) from the wafermap server or local disk or floppy disk. The wafermap is displayed (Step 203). The system also displays the two cutter coordinate positions.

Figure 10:
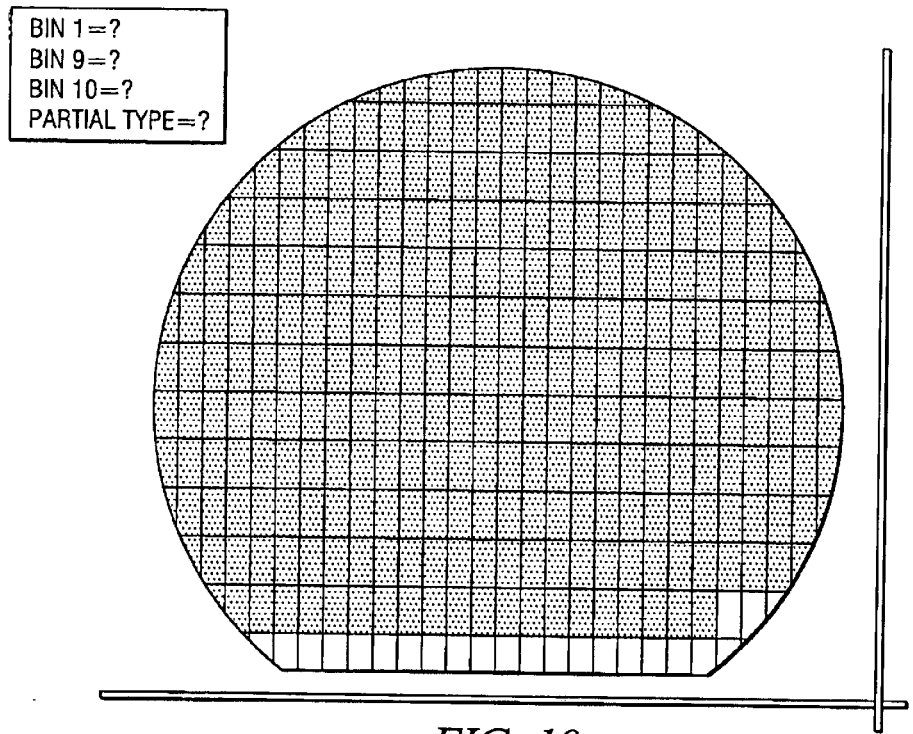
FIG. 10 illustrates two cutters and queries to select the position of the two cutters.

In Step 204 the tool 10 requests entry by the user of the number of dies in a particular Bin number such as good or best dies in Bin 1. In FIG. 10 this is represented by the query Bin 1=? Other Bin numbers may be selected.

In Step 205 the tool requests the user to input the partial wafer type such as half or quarter? The partial wafer type in FIG. 10 illustrates this.

The number of dies with the Bin such as Bin 1 and the type of partial wafer type is then inputted by the user (Step 206).

Figure 11:
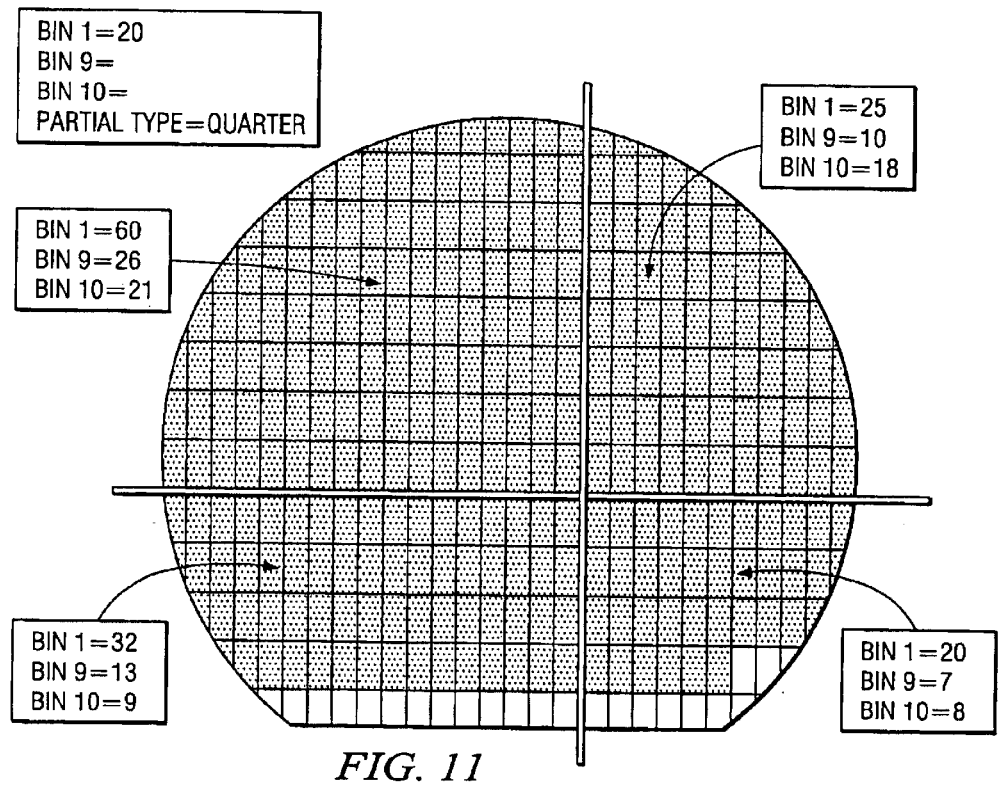
FIG. 11 illustrates two cutters with the bin details of quarter wafer type.
Figure 12:
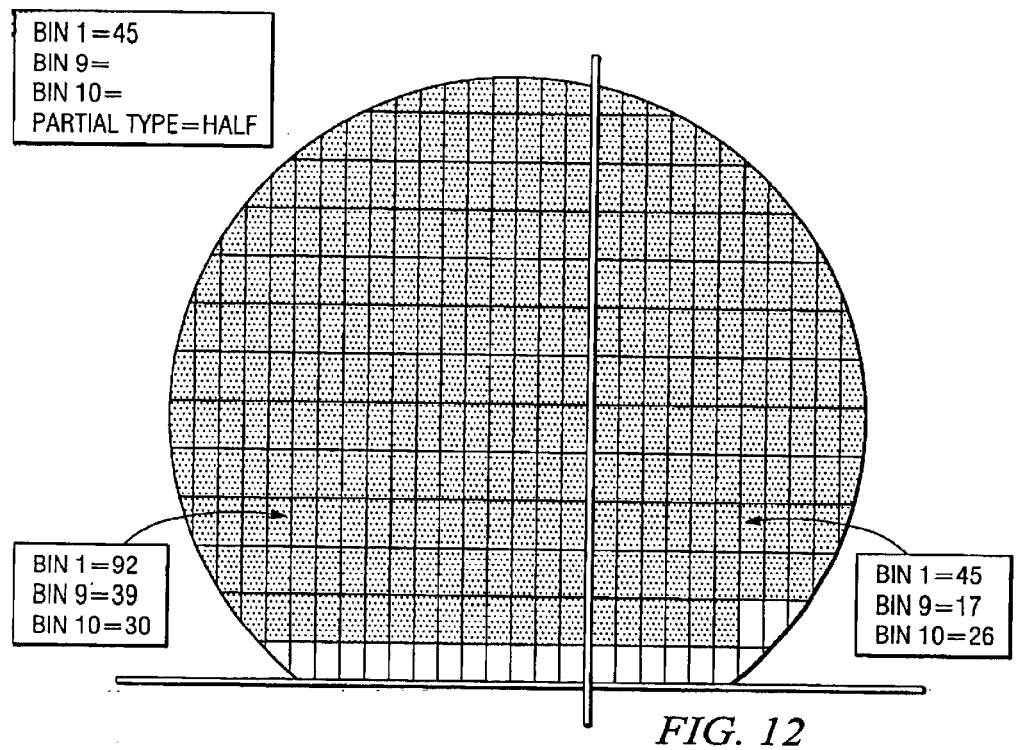
FIG. 12 illustrates two cutters with bin details of half wafer type.
Figure 13:
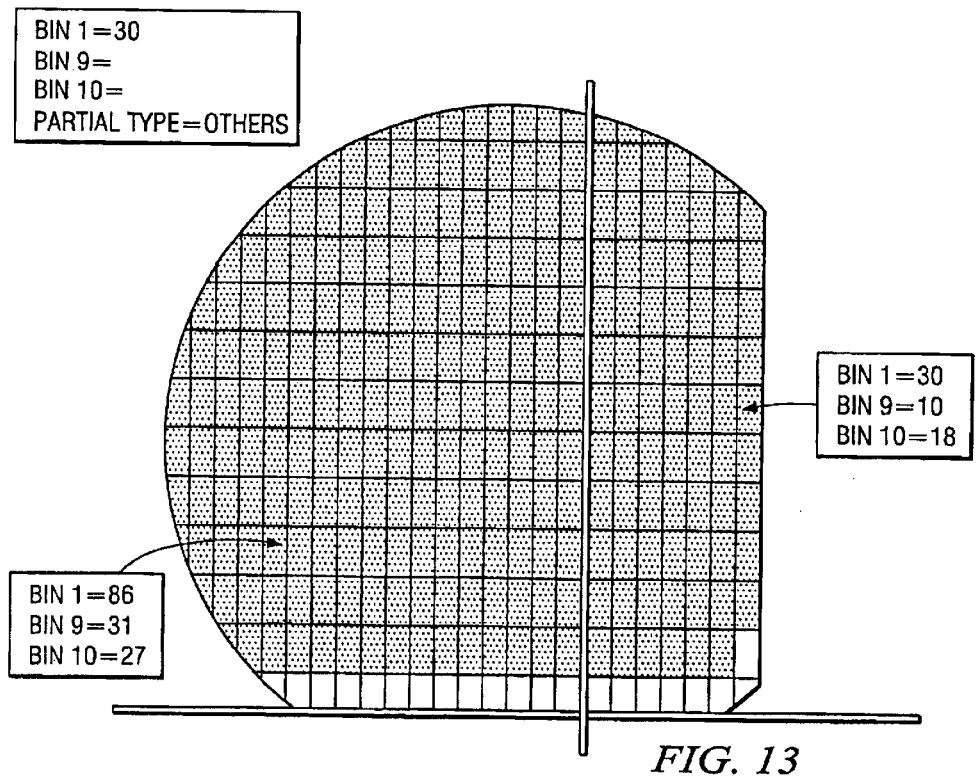
FIG. 13 illustrates two cutters with bin details of a partial wafer.

The processor 17 automatically searches out the wafermap data for a match of user inputted partial wafer type and user inputted number dies of a Bin type, such as good dies in Bin 1 for example, and determines and generates at display 21 the coordinate position of the cutters and the partial wafer (Step 207). See FIG. 11. The display for half wafer types is illustrated with Bin the numbers is illustrated in FIG. 12. The display for partial wafer is illustrated with Bin numbers in FIG. 13.

The user may then send the determined position of the cutters from the tool 10 in FIG. 5 to the cutting system 11 and the selected partial wafer is cut.

While the invention has been described with reference to two embodiments, it will be apparent by those skilled in the art that various changes in form and detail may be made therein without departing from the spirit and scope of the invention.

What is claimed is:

1. A method of determining the cut position for a partial wafer comprising the steps of:

getting wafermap data;

displaying wafermap data, displaying cutter coordinates; and moving displayed cutter coordinates relative to the wafermap and generating bin details for resultant partial wafer that results from cuts at displayed cutter position.

2. The method of claim 1 including the step of getting wafer identification information.

3. The method of claim 1 including displaying the coordinates of a pair of orthogonal cutters and moving the displayed pair of cutters to get bin details.

4. A method for deciding and providing a partial wafer size for production demands comprises the steps of:

getting wafermap data, displaying the coordinates of the one or more cutters relative to the wafer to be cut, and moving the displayed coordinates of said one or more cutters relative to the wafer and generating bin details of resultant partial wafer.

5. The method of claim 4 including the step of getting the wafer identification through a keyboard.

6. A method for deciding and providing a partial wafer size for production demands comprising the steps of:

displaying the coordinates of a pair of orthogonal oriented wafer cutters relative to a wafer or partial wafer, getting wafermap data of good dies;

moving the displayed position of the cutters relative to the wafer; and generating and displaying the results of the type of dies in each partial wafer that would result from the cut according to said wafermap data.

7. A method for deciding and providing a partial wafer size for production demands comprising the steps of:

identifying the wafer;

getting the wafermap data;

automatically querying the user for the number of good dies wanted and the type of partial wafer selected; and automatically displaying the cut position coordinates for one or more cutters.

8. A tool for deciding and providing a partial wafer size for production comprising:

means for getting wafer identification;

means for getting wafermap data;

means for determining the position of the one or more cutters ;and means for moving the displayed position of the cutters relative to the wafer and generating and displaying the results of the type of dies in each partial that would result from a cut according to said displayed position of the cutters.

9. The tool of claim 8 wherein said cutters are two and they are orthogonal to each other.

10. A tool for deciding and providing a partial wafer size for production comprising:

means for identifying the wafer;

means foe getting the wafermap data;

means for automatically querying the user for the number of good dies wanted and the type of partial wafer selected; and said tool automatically deciding and displaying the cut position or one or more cutters based o the number of good dies wanted and the type of partial wafer selected.

* * * * *